United States Patent
Schofield et al.

(10) Patent No.: US 7,471,229 B2
(45) Date of Patent: Dec. 30, 2008

(54) ANALOG-TO-DIGITAL CONVERTER WITH LOW LATENCY OUTPUT PATH

(75) Inventors: William George John Schofield, North Andover, MA (US); Joseph Bradford Bannon, Greensboro, NC (US); Carroll Speir, Pleasant Garden, NC (US); Scott Bradsley, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/731,926

(22) Filed: Apr. 2, 2007

(65) Prior Publication Data
US 2007/0290913 A1 Dec. 20, 2007

Related U.S. Application Data

(60) Provisional application No. 60/813,922, filed on Jun. 15, 2006.

(51) Int. Cl.
*H03M 1/12* (2006.01)
(52) U.S. Cl. ...................... 341/162; 341/156
(58) Field of Classification Search .......... 341/130–170
See application file for complete search history.

(56) References Cited

U.S. PATENT DOCUMENTS

| 5,245,343 | A | * | 9/1993 | Greenwood et al. | ......... 341/143 |
| 6,731,231 | B2 | * | 5/2004 | Roovers et al. | ............ 341/156 |
| 6,791,484 | B1 | * | 9/2004 | Lee et al. | .................... 341/118 |
| 7,068,107 | B2 | * | 6/2006 | Wang et al. | ................. 330/282 |
| 7,088,281 | B1 | * | 8/2006 | Menkus | ...................... 341/156 |
| 7,256,725 | B2 | * | 8/2007 | Mulder | ....................... 341/172 |
| 7,292,169 | B2 | * | 11/2007 | Mori et al. | ................... 341/139 |
| 7,352,310 | B2 | * | 4/2008 | Mori et al. | ................... 341/139 |

OTHER PUBLICATIONS

Voicu Z. Groza, *High Resolution Floating-Point ADC*, IEEE Transactions on Instrumentation and Measurement, vol. 50, No. 6, Dec. 2001, pp. 1822-1829. AD6650, Diversity IF-to-Baseband GSM/EDGE Narrow-Band Receiver, Analog Devices, Inc. 2006.

* cited by examiner

*Primary Examiner*—Lam T Mai
(74) *Attorney, Agent, or Firm*—Iandiorio Teska & Coleman

(57) ABSTRACT

An analog to digital converter system includes at least one stage for providing a first full precision, full latency output and a second output providing a less than full latency, less than full precision coarse level indicator signal.

17 Claims, 4 Drawing Sheets

US 7,471,229 B2

ANALOG-TO-DIGITAL CONVERTER WITH LOW LATENCY OUTPUT PATH

RELATED APPLICATIONS

This application claims benefit of and priority to U.S. Provisional Application Ser. No. 60/813,922 filed Jun. 15, 2006 incorporated herein by this reference.

FIELD OF THE INVENTION

This invention relates to an improved analog to digital converter system which provides a less than full precision, less than full latency output as a coarse signal level indicator, and more particularly to such a system in which the coarse signal level indicator can be used to define a control loop such as a fast attack element in an AGC gain loop.

BACKGROUND OF THE INVENTION

A variable gain amplifier (VGA) often precedes an analog-to-digital converter (ADC) to ensure that the signal at the ADC input does not cause the ADC to overrange. The gain of the VGA is usually set depending on the characteristics of the input signal; a signal with infrequent peaks may be allowed to overrange the ADC, if the input signal is highly over-sampled. Alternatively, a highly deterministic input signal may have the gain modified in anticipation of an overrange event. This leads to many different ways to implement an automatic gain control (AGC) loop between the ADC and the VGA. A generic AGC loop can consist of three elements: firstly a fast response element which is responsible for detecting peaks very fast and providing information to the AGC controller to determine if a gain change is required; this is often referred to as a fast attack loop. The second element is one which looks at some form of average of the entire signal at the ADC input and provides information to the AGC controller; the last element is one which looks at specific parts (channel) of the signal at the ADC input and provides that information to the AGC controller. The AGC controller can then determine how the gain of the VGA needs setting depending upon whether it needs to allow for fast overranges, average input signal levels or specific channel signal levels.

A very common method of implementing an AGC loop with a digital control algorithm is to use the ADC output as a signal level indicator. For the average signal level and the per channel signal level averaging is done, so the output of the ADC can be used. However, if an ADC with more than one clock cycle of latency is used and the final output of the ADC is used to implement a fast attack loop, it is possible that several samples could be overranged before the AGC controller has time to adjust the gain. A common approach to address this are to run the ADC at a higher sample rate, over sampling the ADC input and thereby shortening the absolute response time to an overrange event.

BRIEF SUMMARY OF THE INVENTION

It is therefore an object of this invention to provide an improved analog to digital converter system which provides a less than full latency, less than full precision output as a coarse signal level indicator.

It is a further object of this invention to provide such an improved analog to digital converter system which is applicable to any converter with a latency of more than one clock cycle.

It is a further object of this invention to provide such an improved analog to digital converter system which is applicable to multi-stage e.g. pipeline and $\Delta\Sigma$ ADCs as well as iterative ADCs e.g. successive approximation ADCs.

It is a further object of this invention to provide such an improved analog to digital converter system which is able to respond more quickly to fast transients to prevent overranging.

It is a further object of this invention to provide such an improved analog to digital converter system which is able to respond more quickly to drive a fast attack circuit to adjust a variable gain amplifier to prevent overranging.

It is a further object of this invention to provide such an improved analog to digital converter system in which stages of the converter are on one chip and the gain control circuit and variable gain amplifier are on one or more others.

The invention results from the realization that an improved analog to digital converter system which provides in addition to a first, full precision, full latency output, a second less than full precision, less than full latency output as a coarse signal level indicator which can be used, for example, to operate a control loop such as an AGC gain loop.

The subject invention, however, in other embodiments, need not achieve all these objectives and the claims hereof should not be limited to structures or methods capable of achieving these objectives.

This invention features an analog to digital converter system including at least one stage for providing a first full precision, full latency output; and a second output providing a less than full latency, less than full precision coarse level indicator signal.

In a preferred embodiment there may be a number of stages. The second output may be a multi-bit output. The second output may be a single-bit output. The system may be a pipeline system and there may be a coarse stage and at least one or more additional stages for providing the first, full precision, full latency output and the coarse stage may provide the second output. The system may be a successive approximation system and the second coarse output may be derived from an early iteration. The system may be a $\Delta\Sigma$ system. There may be a signal processing circuit for transforming the format of the second output. There may be a variable gain amplifier for providing an input to the stage; the variable gain amplifier may be responsive to the second output to prevent overranging of the system. There may be a variable gain amplifier for providing an input to the stage and a gain control circuit responsive to the second output to adjust the gain of the gain control amplifier to prevent overranging of the system. The gain control circuit may include any or all of a fast attack circuit, wide band circuit and single channel circuit, and the second output drives the fast attack circuit. The stages may be on one chip and the gain control circuit on another.

This invention also features an analog to digital converter system with low latency overrange prevention including at least one stage for providing a first full precision, full latency output; a second output providing a less than full latency, less than full precision coarse level indicator signal; and a variable gain amplifier for providing an input to the stage and a gain control circuit responsive to the second output to adjust the gain of the gain control amplifier to prevent overranging of the system.

This invention also features an analog to digital converter system with low latency fast attack overrange prevention including at least one stage for providing a first full precision, full latency output; a second output providing a less than full latency, less than full precision coarse level indicator signal;

a variable gain amplifier for providing an input to the stage; and a gain control circuit including a fast attack circuit, wide band circuit and single channel circuit, and the second output drives the fast attack circuit.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
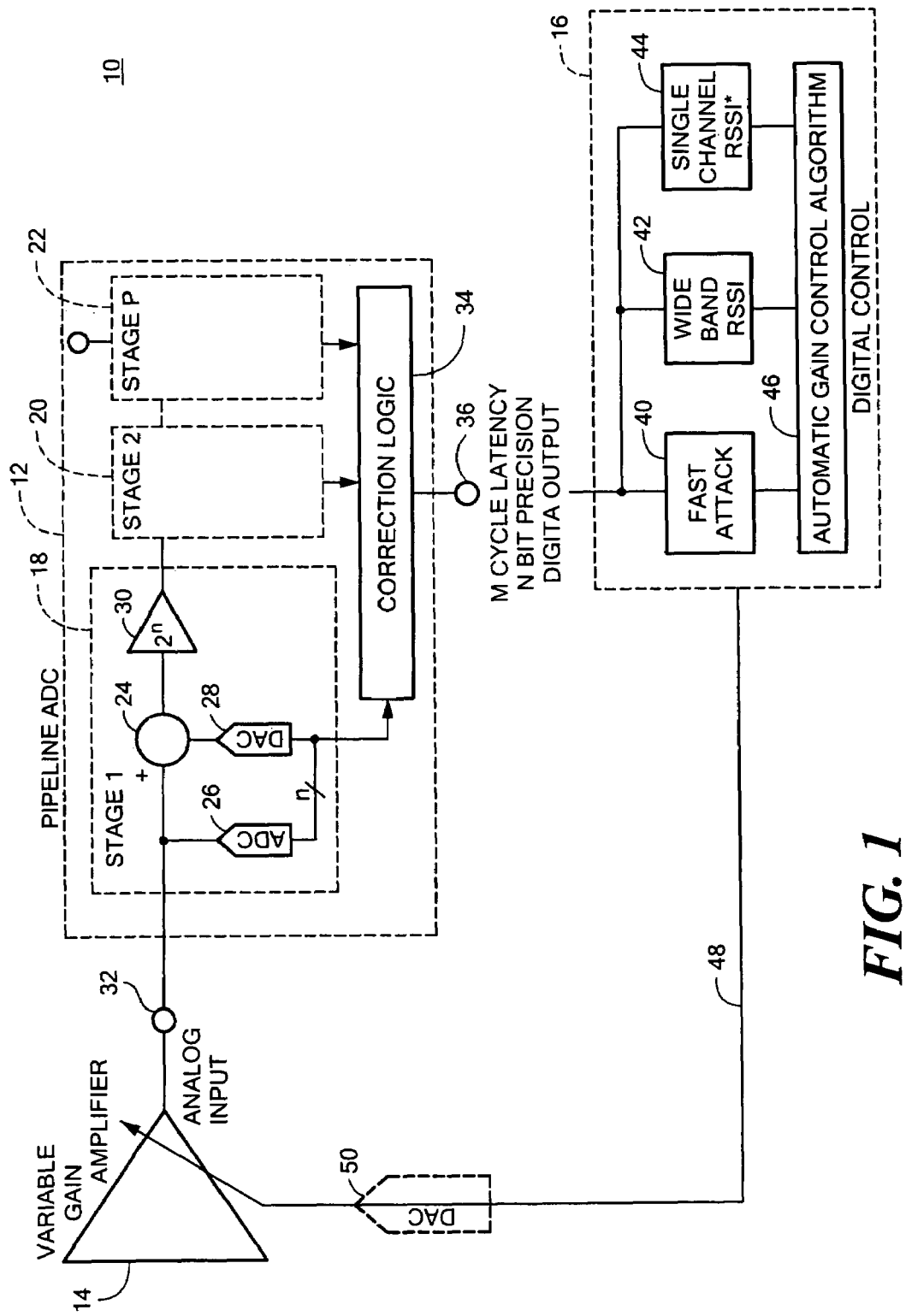
FIG. 1 is a schematic block diagram of a prior art analog to digital converter system with variable gain amplifier (VGA) and automatic gain control (AGC)

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a conventional analog to digital converter system 10 including analog to digital pipeline converter 12, variable gain amplifier 14 and automatic gain control circuit 16. Pipeline ADC 12 may include one or more stage 1, 18, stage 2, 20, stage P, 22. Each stage may include a subtractor 24, analog to digital converter circuit 26, digital to analog converter circuit 28, and the residue amplifier 30 having a gain of $2^n$ where n is the number of digits of resolution to be provided by the circuit.

In operation analog signal at input 32 is digitized by analog to digital converter 26 which provides a coarse digital output to correction logic 34 and to DAC 28. DAC 28 converts the coarse digital output to an analog output which is subtracted from the original analog input at 32. The residue signal is output to amplifier 30 where it is gained up by a factor of $2^n$. Stage 1, 18 provides output to the next stage 20 which repeats the same operation as stage 1, 18 and so on to stage P, 22. The output from each of the stages 18, 20, 22 is delivered to correction logic 34 which may adjust, for example, the timing or the format of the signals e.g. from thermometer code to binary code. The digital signal output is provided at output 36.

This output has the full N bit precision of ADC 12 and the full M cycle latency. Latency is a measure of time or cycles that it takes for an input to reach the full N bit precision output in this case it is denominated M cycle latency. That full N bit precision, full M cycle latency output signal on 36 is delivered to the AGC 16 which typically includes a fast attack circuit 40, wide band receive signal strength indicator (RSSI) 42 and signal channel RSSI 44. All of which drive automatic gain control algorithm 46. The output from AGC 16, on line 48, is a digital signal and is provided to variable gain amplifier 14 to adjust its gain in accordance with the decision made in the automatic gain control algorithm 46. If variable gain amplifier is an analog controlled amplifier then a DAC 50 may be interposed in the output line 48. One shortcoming of this prior art device is that all of the gain control input circuits fast attack 40, wide band RSSI 42, single channel RSSI 44, must wait for the full M cycle latency and the full N bit precision output before the automatic gain control algorithm can be executed. As pointed out in the Background of Invention this has numerous shortcomings.

Figure 2:
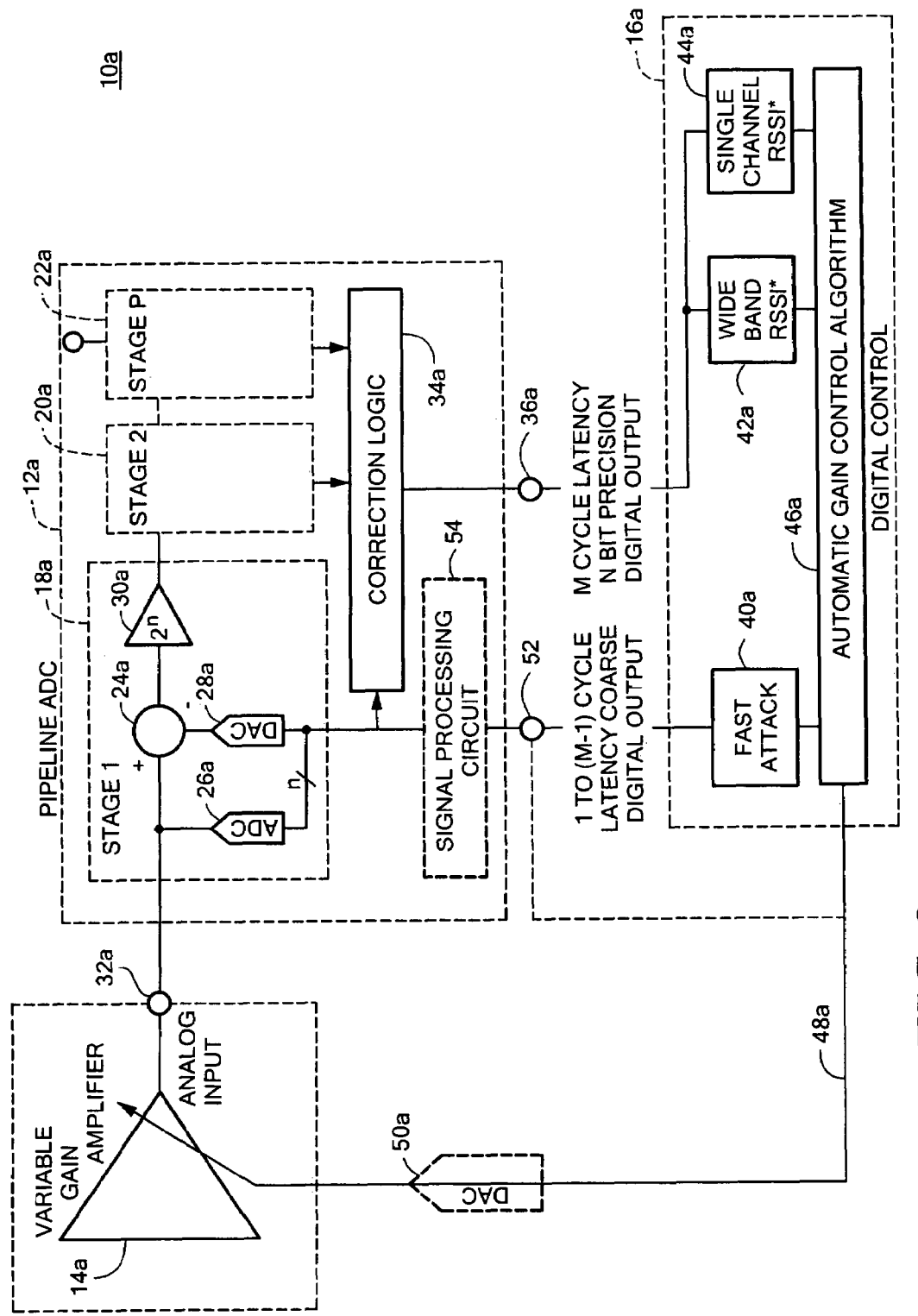
FIG. 2 is a view similar to FIG. 1 of an analog to digital converter system according to this invention with a low latency coarse signal level indicator in an AGC loop for driving an AGC.

In accordance with this invention, FIG. 2, there is a second output 52 which provides a less than full precision, less than full latency e.g. faster coarse level indicator signal by tapping directly from the first stage or stages (in this case just stage 18a) to provide an output which can be used quickly, immediately, by fast attack circuit 40a with automatic gain control algorithm 46a to provide an output on line 48a directly or indirectly through DAC 50a to variable gain amplifier 14a to prevent overrange operation of analog to digital circuit 12a due to fast transients occurring in the input signal. Although the second, coarse output here, in this embodiment, is shown as being derived from the very first stage, it could be derived from the first or any subsequent stage which has less than the full latency and generally less than the full bit precision depending on how quickly it is desired to execute the fast attack adjustment of the input signal. The coarse signal at 52 can be delivered unprocessed to fast attack 40a or it can be processed first through a signal processing circuit 54 if desired. It may be an n bit signal e.g. three or four bits for example, as shown, or that output signal at 52 can be a single signal such as an overrange flag which is conventionally attainable only at full latency. AGC circuit 16a may include one or more of a fast attack circuit 40a wide band circuit 42a and single channel circuit 44a.

Figure 3:
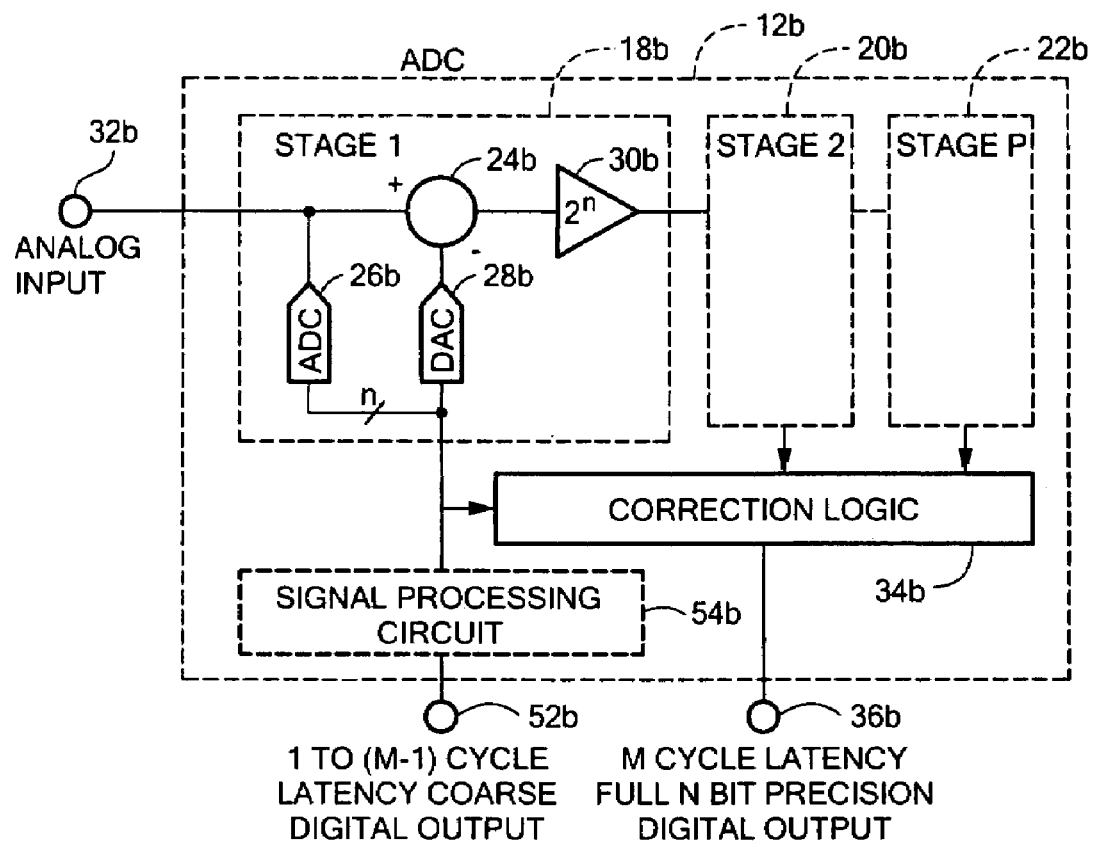
FIG. 3 is a simplified view similar to FIG. 2 of an analog to digital converter system according to this invention.

More generally, FIG. 3, analog to digital converter system 10b provides its second output 52b as a coarse level indicator signal for any purpose, for example, of control or information. The purpose is to gain an informational signal before full latency at full N bit precision especially when the less than full latency is important to the information and perhaps more important than the N bit precision available by awaiting the full M cycle latency.

Figure 4:
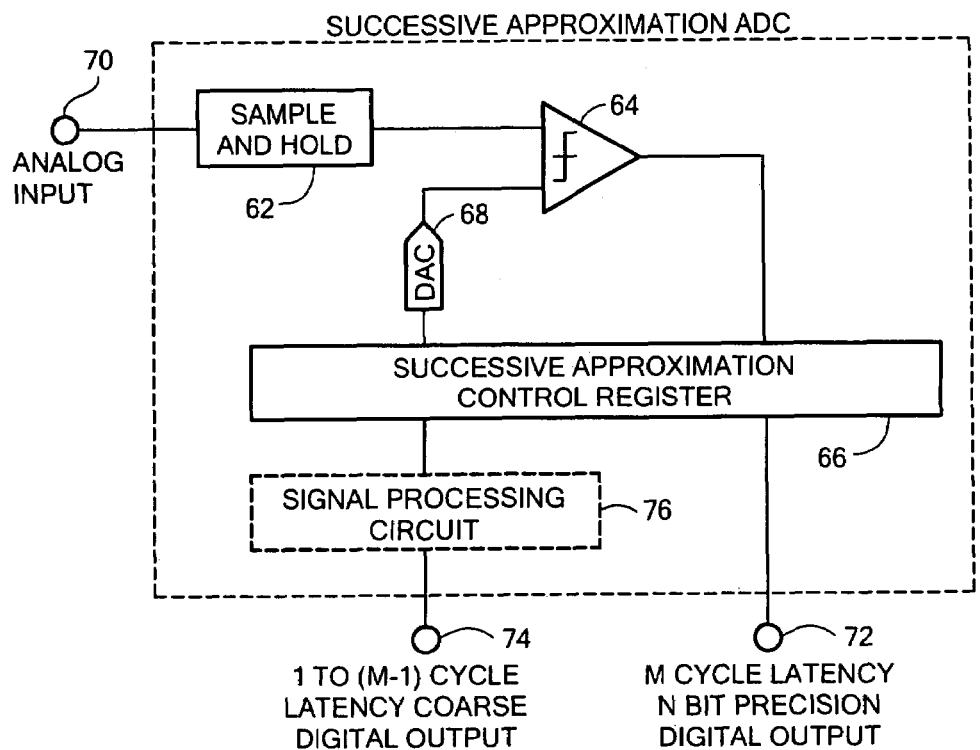
FIG. 4 is a simplified view similar to FIG. 2 of an analog to digital converter system according to this invention implemented with a successive approximation type ADC converter.

This invention is not limited to pipeline analog to digital converter systems as shown in FIGS. 2 and 3: it may also be employed in successive approximation analog to digital converter 60, FIG. 4. Successive approximation ADC 60 includes a sample and hold circuit 62, threshold comparator 64, successive approximation control register 66 and digital to analog converter 68. An input signal at input 70 will be sampled and held for a number of sample cycles, for example 16 in sample and hold circuit 62. While that sample is available it is compared to a threshold level provided by DAC 68 under control of successive approximation control register 66. Threshold comparator 64 indicates the difference between the reference provided by DAC 68 and the sampled and held signal at 62 in the first iteration. In the second iteration successive approximation control register 66 moves the threshold provided by DAC 68 to converge on the signal of sample and hold circuit 62. This operation continues over many iterations e.g. sixteen when at the full M cycle latency and full N bit precision an output is provided at 72. However, in accordance with this invention after the first iteration or an early iteration less than the full number of iterations, for example sixteen in this particular example, a second output is provided at output 74 in less than the M cycle latency, that is, M−1 cycles or fewer. If desired, a signal processing circuit 76 similar to the previous signal processing circuits may be interposed to condition the signal in any particular format.

Figure 5:
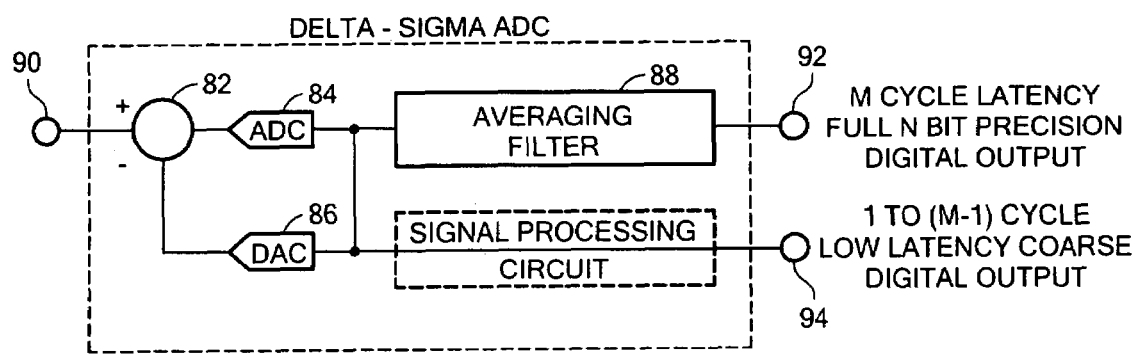
FIG. 5 is a simplified view similar to FIG. 2 of an analog to digital converter system according to this invention implemented with a ΔΣ converter.

An analog to digital converter system, according to this invention, may also be implemented using a ΔΣ analog to digital converter 80, FIG. 5, which includes a differencing circuit 82, ADC 84, DAC 86 and an averaging filter 88. The input signal provided at input 90 has subtracted from it a coarse version of itself. The input signal 90 is converted from analog to digital by ADC 84 and then back from digital to analog by DAC 86. This coarse analog signal is subtracted from the input analog signal at 90 and that difference is re-digitized again through ADC 84. The output from ADC 84 is averaged by averaging filter 88 in a conventional way to provide a full N bit precision output after M cycles of full latency. However, in accordance with this invention, a second output at 94 can be derived after the signal has been digitized by ADC 84 and before it goes through averaging filter 88. This can be as early as the first cycle of operation or anytime after that less than the full latency of the system. This again provides a low latency (M−1) coarse digital output which can be used to drive a variety of external systems, for example, a control loop such as a automatic gain control variable gain amplifier loop to prevent ADC overrange.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An analog to digital converter system comprising:
   at least one stage for providing a first full precision, full latency output; and
   a second output providing a less than full latency, less than full precision coarse level indicator signal provided directly or indirectly to a variable gain amplifier to prevent overranging of the system.

2. The analog to digital converter system of claim 1 in which there are a number of said stages.

3. The analog to digital converter system of claim 1 wherein said second output is a multi-bit output.

4. The analog to digital converter system of claim 1 wherein said second output is a single-bit output.

5. The analog to digital converter system of claim 1 in which said system is a pipeline system and there is a coarse stage and at least one or more additional stages for providing said first, full precision, full latency output and said coarse stage provides said second output.

6. The analog to digital converter system of claim 1 in which said system is a successive approximation system and said second coarse output is derived from an early iteration.

7. The analog to digital converter system of claim 1 in which said system is a ΔΣ system.

8. The analog to digital converter system of claim 1 further including a signal processing circuit for transforming the format of said second output.

9. The analog to digital converter system of claim 1 further including a variable gain amplifier for providing an input to said stage, said variable gain amplifier being directly or indirectly responsive to said second output to prevent overranging of the system.

10. The analog to digital converter system of claim 1 further including a variable gain amplifier for providing an input to said stage and a gain control circuit responsive to said second output to adjust the gain of said gain control amplifier to prevent overranging of the system.

11. The analog to digital converter system of claim 10 in which said gain control circuit includes at least one of a fast attack circuit, wide band circuit and single channel circuit, and said second output drives said fast attack circuit.

12. The analog to digital converter system of claim 10 in which said stages are on one chip and said gain control circuit on another.

13. An analog to digital converter system with low latency overrange prevention comprising:
   at least one stage for providing a first full precision, full latency output;
   a second output providing a less than full latency, less than full precision coarse level indicator signal; and
   a variable gain amplifier for providing an input to said stage and a gain control circuit responsive to said second output to adjust the gain of said gain control amplifier to prevent overranging of the system.

14. An analog to digital converter system with low latency fast attack overrange prevention comprising:
   at least one stage for providing a first full precision, full latency output;
   a second output providing a less than full latency, less than full precision coarse level indicator signal;
   a variable gain amplifier for providing an input to said stage; and
   a gain control circuit including a fast attack circuit, a wide band circuit and a single channel circuit, said second output driving said fast attack circuit.

15. An analog to digital converter system comprising:
   at least one stage for providing a first full precision, full latency output; and
   a second output providing a less than full latency, less than full precision coarse level indicator signal provided to a variable gain amplifier to prevent overranging of the system,
   said system being a successive approximation system and said second coarse output derived from an early iteration.

16. An analog to digital converter system comprising:
   at least one stage for providing a first full precision, full latency output; and
   a second output providing a less than full latency, less than full precision coarse level indicator signal provided to a variable gain amplifier to prevent overranging of the system,
   said system being a ΔΣ system.

17. An analog to digital converter system comprising:
   at least one stage for providing a first full precision, full latency output;
   a second output providing a less than full latency, less than full precision coarse level indicator signal provided to a variable gain amplifier to prevent overranging of the system; and
   a signal processing circuit for transforming the format of said second output.

* * * * *